United States Patent
Hücker et al.

(10) Patent No.: US 6,418,385 B1
(45) Date of Patent: Jul. 9, 2002

(54) METHOD FOR DETERMINING THE LOCATION OF A PARTIAL DISCHARGE

(75) Inventors: Thomas Hücker, Dallgow-Döberitz; Jörg Gorablenkow, Berlin, both of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/403,239

(22) PCT Filed: Apr. 16, 1998

(86) PCT No.: PCT/DE98/01092
§ 371 (c)(1),
(2), (4) Date: Jun. 6, 2000

(87) PCT Pub. No.: WO98/47213
PCT Pub. Date: Oct. 22, 1998

(30) Foreign Application Priority Data

Apr. 16, 1997 (DE) .......................... 197 16 963

(51) Int. Cl.[7] .......................... G06F 15/00; G01R 19/00
(52) U.S. Cl. .......................... 702/64; 702/182; 706/15; 706/20
(58) Field of Search .............................. 702/64–65, 77, 702/56, 91, 182–183, 185; 706/15, 20, 23, 25; 73/658, 659

(56) References Cited

U.S. PATENT DOCUMENTS

| | | | |
|---|---|---|---|
| 5,305,235 A | * 4/1994 | Izui et al. | 702/185 |
| 5,419,197 A | * 5/1995 | Ogi et al. | 702/185 |
| 5,537,327 A | 7/1996 | Snow et al. | |
| 5,627,941 A | * 5/1997 | Takahashi et al. | 706/25 |
| 5,838,881 A | * 11/1998 | Nelson et al. | 706/31 |

FOREIGN PATENT DOCUMENTS

| | | |
|---|---|---|
| DE | 43 33 259 | 5/1995 |
| EP | 0 241 764 | 10/1987 |
| EP | 0 572 767 | 12/1993 |

OTHER PUBLICATIONS

Patent Abstracts of Japan, vol. 107, No. 076 (P–1487), Feb. 16, 1993 & JP 04 279870 (Hitachi Cable Ltd.) Oct. 5, 1992.

A. Schnettler et al., "Artificial self–organizing neural network for partial discharge source recognition," Archiv für Elektrotechnik 76 (1993) pp. 149–154.

* cited by examiner

Primary Examiner—John S. Hilten
Assistant Examiner—Bryan Bui
(74) Attorney, Agent, or Firm—Kenyon & Kenyon

(57) ABSTRACT

In a high-voltage installation, for example a tube gas line, several partial discharge measurement probes are provided that detect electromagnetic signals of partial discharges. The corresponding measurement data is supplied to an evaluation device that includes a neural network that is trained in such a way that it determines the location of occurrence of the partial discharge from the measurement data of two sensors.

7 Claims, 1 Drawing Sheet

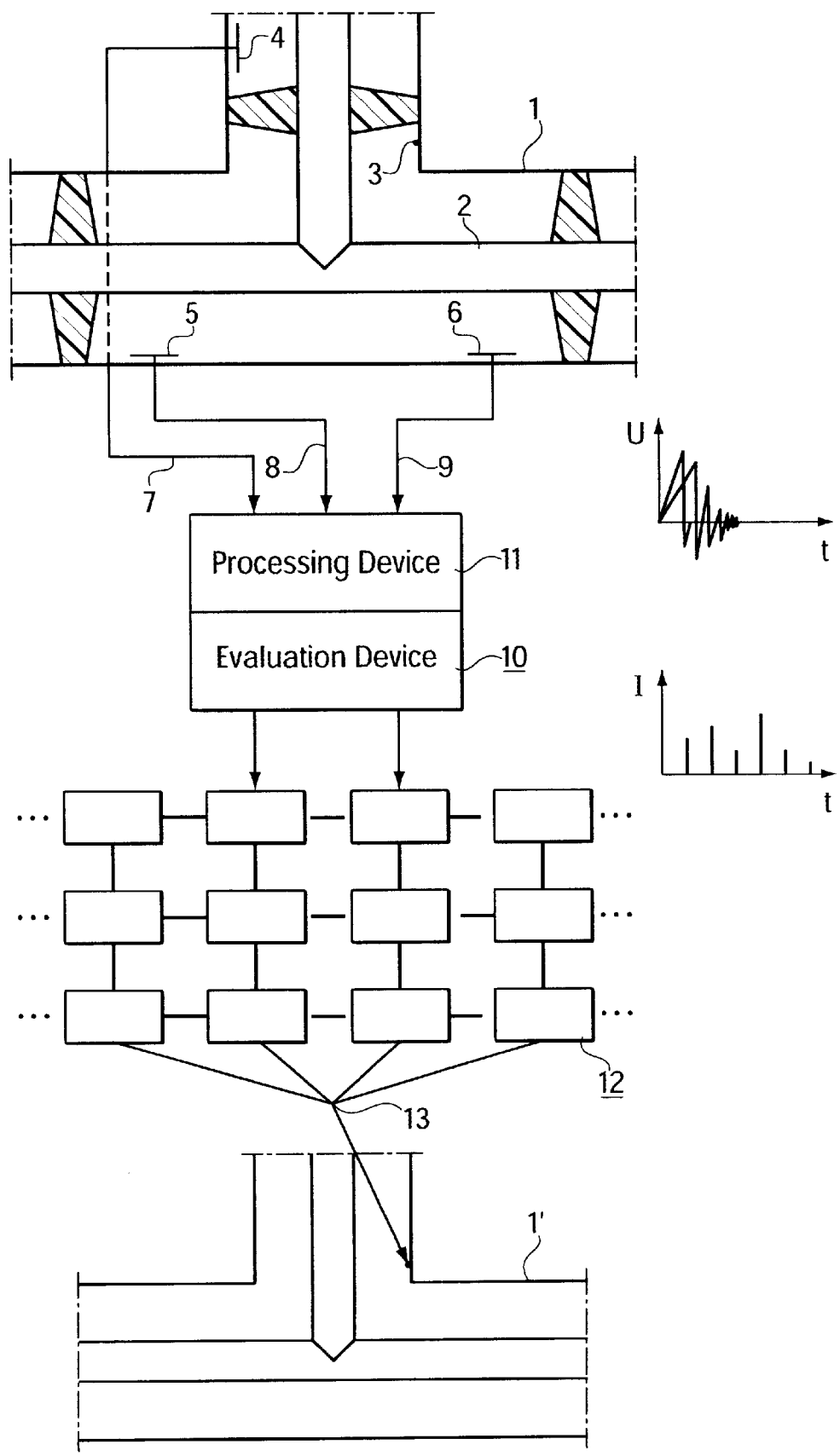

METHOD FOR DETERMINING THE LOCATION OF A PARTIAL DISCHARGE

FIELD OF THE INVENTION

The invention relates to a method for determining the location of a partial discharge in a high-voltage installation, in which signals produced by a partial discharge are detected and supplied to an evaluation device.

BACKGROUND INFORMATION

A method for investigating partial discharges is described in for example, European Patent No. 0 241 764 A1. This patent describes that high frequency measurement values of electrical partial discharges (PD) in a high-voltage installation are picked up by several sensors and are compared with particular values, which for their part arise through simulation of partial discharges in a simulated network that corresponds, with regard to the modeling, to the present high-voltage installation with respect to the high-frequency behavior. By comparison of the measured values with the values obtained in the simulation, the location and type of partial discharge can be inferred.

For the execution of the described method, a precise analysis of the present high-voltage installation is necessary with respect to the high-frequency behavior and the transmission characteristics. This requires the creation of a new simulation network for each installation. The operational expense for this is considerable.

Am the article entitled "Artificial self-organizing neural network for partial discharge source recognition," Archiv fur Electrotechnik, 76 (1993), p. 149–154, describes for the investigation of electrical partial discharges with the aid of a previously trained neural network. The neural network is trained beforehand on the basis of actual partial discharges that are detected by a sensor. Using this method, causes corresponding to occurring partial discharges can be determined.

German Patent No. 43 33 259 describes a method for locating electrical disturbances in the form of short-circuit currents, which likewise works with the aid of a neural network trained with measurement data obtained by a single sensor. The result of the method specified there is a directional indication that relates to the direction in which a short circuit can be found, seen from a point of detection.

SUMMARY

An object of, the present invention is to provide a method for determining the location of a partial discharge in a high-voltage installation that is simple and can be carried out at low expense and with high precision, and that can be adapted to different designs of the high-voltage installation at low expense, yet nonetheless provides individually optimized results.

This object is achieved according to the present invention in that the evaluation device includes a neural network that has been trained beforehand by the input of partial discharge measurement data, measurement data detected by at least two sensors being supplied to the neural network for training purposes, with simultaneous stipulation of the locations of occurrence of the corresponding partial discharges, and measurement data of the at least two sensors likewise being supplied to the evaluation device for the investigation of a partial discharge.

Due to the use of a neural network for the evaluation, the high-voltage installation need no longer be analyzed with regard to its high-frequency behavior. It is no longer necessary, to determine a transmission coefficient, an attenuation coefficient, and a reflection coefficient for individual elements of the high-voltage installation. The adaptation of the evaluation device, i.e., the training of the neural network, is thus possible at an expense for each switching installation to be constructed that is considerably lower than is the case for the corresponding analysis of the high-voltage installation and the creation of a network simulation.

The precision and reliability of the determination of the results by the neural network is dependent primarily on the number and spatial distribution of the sensors, the quality of the training, and the number of training measurements. Standards can be determined for these, so that the method can also be carried out by non-qualified personnel.

The use of at least two sensors simplifies the location procedure considerably, and makes the results more precise. The analyzable database is significantly improved not only by the number of available data, but also by the different perspective of different sensors with respect to the location to be determined of the partial discharge.

The training of the neural network can also include disturbing signals that originate from genuine partial discharges in the high-voltage installation, to be distinguished from events that represent either regular occurrences (actuation of switches) or disturbances radiated in from the outside.

An advantageous embodiment of the present invention provides that before being input into the neural network, the measurement data is pre-processed in a processing device that forms a part of the evaluation device.

In this way, the measurement data can be prepared in such a way that the data has a high degree of significance with respect to the location of partial discharges, and that the result after passing through the neural network thus becomes still more reliable and precise.

Another advantageous embodiment of the present invention provides that more than two sensors are provided, the evaluation device being supplied only with the measurement data of the two sensors yielding the greatest signal strength of the partial discharge signals.

Through such a selection of the measurement data supplied to the evaluation device, a better degree of reliability is likewise achieved in the processing by the neural network.

Moreover, the present invention can advantageously be designed so that the measurement data is analyzed in the processing device with respect to frequency.

In this way, signals that do not originate from genuine partial discharges are not taken into account in the analysis, since actual partial discharge processes have a high correlation with the network frequency.

It is also possible to construct the present invention in such a way that the correlation of the measurement data with the network frequency, or with whole-number multiples thereof, is determined, and that only measurement data whose correlation value exceeds a determined value are supplied to the neural network.

Correspondingly pre-processed signals must then be supplied to the neural network already during the training thereof.

It is likewise possible to construct the present invention such that particular phase angles of the partial discharge signals to the useful frequency, and particular signal strengths, are respectively assigned the frequency with which these values occur in a partial discharge measurement, and that these frequency values are supplied to the neural network.

An additional advantageous embodiment of the present invention provides that the impulse curve of a partial discharge signal in the time domain is detected and is supplied to the neural network.

In this case as well, the neural network must be trained with correspondingly pre-processed signals.

BRIEF DESCRIPTION OF THE DRAWING

The FIGURE shows a schematic of a high-voltage installation with partial discharge measurement devices, and a neural network.

DETAILED DESCRIPTION

In the Figure, sections of an encapsulating housing 1 of a high-voltage installation are shown schematically; the housing is made of metal and surrounds a high-voltage conductor 2 in gas-tight fashion. In the normal case, encapsulating housing 1 is filled with an insulating gas, for example $SF_6$, under high pressure.

In the Figure, a T-piece is shown at which high-voltage conductor 2 branches. The element number 3 designates an irregularity, for example a free particle or an irregularity on the surface of metal encapsulation 1, that can initiate or favor the occurrence of partial discharges. Such partial discharges produce electromagnetic waves that propagate in various modes inside encapsulating housing 1. The signals can be detected by measurement probes 4, 5, 6, each of which has an electrode insulated from encapsulating housing 1 that is connected with a respective measurement line 7, 8, 9, via which the measurement data can be supplied to evaluation device 10.

The detection of modes whose frequency is above the frequency of the TEM mode, i.e., typically in the range above approximately 400 MHz, proves to be particularly advantageous.

In evaluation device 10, a processing device 11 is provided in which the measurement data are pre-processed. Only the measurement data of the two sensors providing the greatest signal strengths are evaluated.

In the evaluation device, the measurement data is subjected to a Fourier transformation, and the correlation to the network frequency (50 Hz) of the alternating current to be distributed in the high-voltage installation is measured. Those signals whose correlation with the useful frequency (=network frequency) is above a particular threshold value are identified as genuine PD signals originating from a PD source located inside the high-voltage installation, since only such signals depend to a high degree on the curve of the useful voltage.

These signals are supplied to a neural network 12 that has been trained previously on the basis of a number of partial discharges whose location of occurrence is known.

At output 13 of the neural network there results a signal that provides information concerning the location of the current partial discharge in a representation 1' of coupling housing 1.

The training of neural network 12 is carried out as follows: A certain number of partial discharges are purposively produced in successive fashion in the high-voltage installation, and the true location of the respective partial discharge is stipulated to the neural network, as a signal to be outputted at output 13. Inside the neural network, at the coupling points between the individual neurons (synapses) particular coupling weights are shifted in such a way that the predetermined result is reproduced for each training case. After a certain number of training passes, the correct value for the location of a partial discharge results with high probability as an output, given the corresponding signal input into the neural network.

The present invention can advantageously be used in complex high-voltage switching installations with many branchings, but also in tube gas conductors with few branchings.

What is claimed is:

1. A method for determining the location of a partial discharge in a high-voltage installation, comprising:

providing at least two sensors;

detecting first partial discharge measurement data with the at least two sensors, the first partial discharge measurement data having corresponding locations of occurrence;

providing the first partial discharge measurement data to a neural network and training the neural network using the first partial discharge measurement data and the corresponding locations of occurrence;

after the training step, detecting second partial discharge measurement data with the at least two sensors;

supplying the second partial discharge measurement data to the neural network, an evaluation device including the neural network; and determining the location of a partial discharge as a function of the second partial discharge measurement data.

2. The method according to claim 1, further comprising:

before supplying the second measurement data to the neural network, processing the second partial discharge measurement data in a processing device, the processing device forming a part of the evaluation device.

3. The method according to claim 2, wherein the processing step includes analyzing the second partial discharge measurement data with respect to frequency.

4. The method according to claim 3, wherein the analyzing step includes the step of correlating the second partial discharge measurement data with one of a network frequency and a whole-number multiple of the network frequency, and wherein only the second partial discharge measurement data whose correlation value exceeds a predetermined value is supplied to the neural network.

5. The method according to claim 2 further comprising:

respectively assigning particular phase angles of the partial discharge signals to a useful frequency, and particular signal strengths, frequency values with which particular phase angles and the particular signal strengths occur in a partial discharge measurement; and providing the frequency values to the neural network.

6. The method according claim 1, wherein the providing step includes the step of providing at least three sensors, and wherein at least one of the first partial discharge measurement data and the second partial discharge measurement data from only two of the at least three sensors is supplied to the neural network, the two of the at least three sensors each having a signal strength greater than the others of the at least three sensors.

7. The method according to claim 1 further comprising:

detecting an impulse curve of a partial discharge signal in a time domain; and supplying the impulse curve to the neural network.

* * * * *